United States Patent [19]

Roberts et al.

[11] Patent Number: 4,484,158
[45] Date of Patent: Nov. 20, 1984

[54] MONOLITHIC CRYSTAL FILTER AND METHOD OF MANUFACTURING SAME

[75] Inventors: Gerald E. Roberts, Lynchburg; Alfred G. Staples, Evergreen, both of Va.

[73] Assignee: General Electric Company, Lynchburg, Va.

[21] Appl. No.: 395,986

[22] Filed: Jul. 7, 1982

[51] Int. Cl.³ .................. H03H 9/05; H03H 9/56
[52] U.S. Cl. .................. 333/191; 29/25.35; 310/348; 333/189; 333/192
[58] Field of Search .................. 333/186–196; 29/25.35; 427/100; 310/320, 321, 340–346, 348, 351–356, 365–366

[56] References Cited

U.S. PATENT DOCUMENTS

| | | | |
|---|---|---|---|
| 3,596,212 | 7/1971 | Werner | 333/191 |
| 3,656,180 | 4/1972 | Braun | 333/191 |
| 3,739,304 | 6/1973 | Braun | 333/192 |
| 3,828,210 | 8/1974 | Livenick et al. | 310/351 X |
| 4,156,214 | 5/1979 | Arvanitis et al. | 333/191 |
| 4,297,659 | 10/1981 | Augst | 333/191 |
| 4,342,014 | 7/1982 | Arvanitis | 29/25.35 X |
| 4,343,827 | 8/1982 | Thompson | 29/25.35 X |

FOREIGN PATENT DOCUMENTS

| | | | |
|---|---|---|---|
| 2925893 | 1/1981 | Fed. Rep. of Germany | 333/189 |
| 1196845 | 7/1970 | United Kingdom | 333/191 |

OTHER PUBLICATIONS

Caruso–"Hermetically Sealed Crystal Device Having Glass Lasing Window", Western Electric Technical Digest, No. 48, Oct. 1977; pp. 9–10.

IEEE Transactions on Sonics and Ultrasonics, Oct. 1973, vol. Su-20, No. 4-An Equivalent Circuit Approach to the Design and Analysis of Monolithic Crystal Filters.

Primary Examiner—Marvin L. Nussbaum
Attorney, Agent, or Firm—Cushman, Darby and Cushman

[57] ABSTRACT

A multi-resonator crystal body is physically supported by electrical lead wires extending from a support substrate having individual shaped electrical conductors thereon which are thus connected to each resonator on the crystal body such that the individual resonator electrodes can be selectively short-circuited, or open-circuited, or displayed to an external electrical network to facilitate final finishing of the resonator electrodes. Predetermined electrical circuits (e.g. a short-circuit effected by conductive cement or paint) are thereafter connected across some of the resonator electrodes via the shaped conductive areas on the support substrate before the entire assembly is encapsulated in a standard pin connector housing arrangement. Besides greatly facilitating the tuning of individual crystal resonators to desired frequencies during the finishing operation, this mounting arrangement is also believed to provide improved temperature characteristics and/or shock mounting of the crystal body.

26 Claims, 7 Drawing Figures

MONOLITHIC CRYSTAL FILTER AND METHOD OF MANUFACTURING SAME

This invention is generally related to monolithic crystal filter structures and to methods of manufacturing same. Some examples of prior such filters and of prior techniques for tuning and/or manufacturing such filters are provided by prior art documents such as the following:

"An Equivalent Circuit Approach To The Design And Analysis Of Monolithic Crystal Filters" by R. C. Rennick, *IEEE Transactions on Sonics and Ultrasonics*, Volume SU-20, No. 4, October 1973 pages 347–354.

U.S. Pat. No. 3,656,180—Braun (1972)
U.S. Pat. No. 3,739,304—Braun (1973)
U.S. Pat. No. 4,156,214—Arvanitis et al (1979)
U.S. Pat. No. 3,596,212—Werner et al (1971)

Rennick outlines an equivalent circuit approach for designing and analyzing monolithic crystal filters. In doing so, he introduces the "tuning frequency" concept for measuring resonator frequencies and explains much of the basic theory underlying coupled multi-resonator crystal filters of this type. The other above cited prior art references teach specific multi-resonator monolithic crystal filter structures.

As will be appreciated by those in the art, optimum performance of a multi-resonator monolithic crystal filter requires that each of the individual resonator structures be tuned as closely as possible to the correct resonator frequency as defined by the loop resonances. Because each of the resonators is always inherently acoustically coupled to other resonators on the crystal wafer, this task is not trivial. Typically, such tuning is achieved by controlled "plate loading". In short, the size, material, mass (e.g. thickness), etcetera of the electrode structures deposited onto the face of a crystal wafer so as to define plural acoustically coupled resonator areas therein constitute parameters which are controlled so as to achieve the desired resonant frequency for each individual coupled resonator.

As will also be familiar to those in the art (e.g. from the Rennick reference), one effective way to measure the resonant frequency of a given resonator requires the ability to selectively short-circuit the resonator in question while all other resonator electrodes are left open-circuited. After the final "finishing" or "plate back" process has been completed, most if not all of the internal pairs of electrodes defining resonator areas are short-circuited to realize the final operational embodiment of the filter structure.

Prior art approaches to physical realization of multi-resonator monolithic crystal filter structures (e.g. see the Arvanitis et al and/or Werner et al patents cited above) do not show fabrication or the manufacturing process, and/or results in a final filter structure that exhibits limited performance characteristics.

This invention provides a substantially improved fabrication technique which greatly facilitates the final tuning or "plate back" of individual resonators to desired operating frequencies while at the same time providing a final filter structure with good temperature characteristics and resistance to damage of the crystal wafer from physical shocks.

The exemplary embodiment of this invention is directed to three acoustically coupled resonators fabricated on a single wafer of quartz. This wafer is physically supported and spaced from a ceramic connection interface substrate by a plurality of lead wires which are, in the preferred embodiment, formed of bent resilient electrical conductors (e.g. beryllium copper). This mounting arrangement not only tends to absorb physical shocks, it also tends to minimize thermal conductivity between the crystal body and the remainder of the structure. In addition, the shaped circuits (e.g. "printed") on the ceramic interface substrate are designed so as to provide separate electrical access to each of the three resonators during the final "finishing" or final "plate back" processes thus permitting selective connection of short-circuits, open-circuits or any other predetermined electrical circuit across the electrodes defining any of the individual resonators. At the same time, the shaped circuits on the interface substrate are designed so as to permit a permanent short-circuit to be quickly and effectively placed across (e.g. by conductive cement or paint) the electrodes of the middle resonator. At the same time, the ceramic interface support board is itself supported by physical and electrical attachment to a standard three pin connector base and the usual encapsulating cover therefor.

The presently preferred exemplary embodiment of a monolithic crystal filter in accordance with this invention includes a multi-resonator crystal body having plural electrically conductive resonator electrode/lead structures disposed on opposite sides and extending to opposite edges of the crystal body. A separate substrate member includes plural electrically conductive shaped lead structures disposed on at least one of its sides and plural electrically conductive support members (e.g. wires) physically support the crystal body spaced-apart from the substrate member. These same conductive support members also simultaneously provide electrical connection between respective ones of the resonator electrode/lead structures on the crystal body and the shaped lead structures on the substrate member. In this manner, the shaped lead structures on the substrate member provide individual electrical connections to each resonator on the crystal body such that the resonator electrodes associated with these resonators can be selectively short-circuited (or open-circuited or connected with any other desired predetermined electrical circuit) to facilitate selective individual tuning of the resonators. Preferably, the shaped lead structures on the substrate member include a pair of substantially adjacent but separate contact areas which are, in the final filter structure, electrically connected thereacross (e.g. with conductive cement or paint) to effect a short-circuit of at least one pair of resonator electrodes.

In the presently preferred exemplary embodiment, the shaped electrical lead structures on the substrate member are disposed on the side which is remote from the spaced apart but physically connected crystal body so as to facilitate selective electrical connection to these shaped lead structures during the final finishing processes. In addition, an electrically conductive shield area is preferably disposed on the side of the substrate member which is nearest the spaced apart crystal body so as to shield the crystal body from the shaped lead members on the other side of the substrate. Where possible, it is also preferred to shape the lead structures on the substrate member so as to pass substantially outside of the shielded area thus minimizing stray capacitance.

As previously mentioned, the presently preferred exemplary embodiment also employs a conventional pin connector base member which has plural electrically conducting pins extending therethrough with one end of the pins physically supporting the substrate member and electrically connected to corresponding respective ones of the electrical lead structures thereon. An encapsulating enclosure is also provided in the exemplary embodiment to protect the substrate and its connected crystal body.

The preferred embodiment of the substrate member includes an array of holes therethrough such that the wire support members can be physically secured therein and at the same time provide electrical connections through the substrate to the shaped electrical conductors on its rear side remote from the crystal body. Each of these wire support members preferably includes a first bent portion which defines a recess into which an edge of the crystal body is affixed (e.g. with conductive cement). A second subsequent bent portion of the wire support members is located between the crystal body and the substrate member so as to provide extra resiliency for absorbing physical shocks. The conductive electrode/lead structures on the crystal body preferably extend to opposing edges of the crystal body such that the wire support members can be affixed to those edges with conductive cement while the other end of the wire support members extend through respective holes in the substrate member and are connected to the shaped electrical conductors on its remote side with electrically conductive cement.

To manufacture the exemplary monolithic crystal filter structure, plural resonator electrode structures are first deposited on opposing faces of a crystal wafer so as to form a multi-resonator crystal body having plural acoustically coupled crystal resonator areas which are typically only approximately tuned to desired frequencies. For example, less than the required electrode mass is initially deposited. The crystal wafer is then mounted to a support substrate using plural electrically conductive support wires through which electrical circuits may be selectively connected to at least one of the resonator electrodes. In effect, the substrate serves not only as a physical support member but also as an electrical connection interface between the crystal wafer and (1) the pin connector base and/or (2) the electrical connections required for the crystal finishing processes.

The formation of the resonator electrodes are then finished while selectively connecting one or more predetermined electrical circuits to at least one of the resonator electrodes so as to tune the resonator areas to desired frequencies using previously known "tuning frequency" techniques. A permanent electrical short-circuit is thereafter effected across at least one of the resonator areas via circuits on the support substrate and the resultant finished multi-resonator monolithic crystal filter structure is then encapsulated in a standard pin connector base.

In the preferred exemplary embodiment, the electrode/lead structures deposited on opposing faces of the crystal wafer also include electrically conductive areas which extend proximate opposing edges of the wafer. These opposing edges of the crystal wafer are thereafter affixed to respective lead wire "frames" having plural electrical connectors which effect respective electrical connections to the conductive areas located proximate the wafer edges. The plural electrical wire conductors are thereafter severed from the integral "palm" portion of the frame which initially maintains them at desired parallel spacings. This severance leaves an array of individual electrical wires connected to and depending from the opposing crystal wafer edges. These depending electrical wires are thereafter inserted through a corresponding array of holes in the support substrate to which they are affixed (e.g. with conductive cement) to effect both mechanical connection and electrical connection to shaped electrical conductors disposed on the remote side of the substrate through which electrical circuits may be selectively connected to the resonator electrodes. Thereafter, the formation of the resonator electrodes is finished (e.g. additional nickel and/or silver is applied thereto so as to increase the mass loading and thus decrease the resonant frequency) while selectively connecting a predetermined electrical circuit (e.g. a short-circuit or open-circuit) to various of the resonator electrodes so as to facilitate tuning of the individual resonator areas to desired frequencies.

These as well as other objects and advantages of this invention will be better understood and appreciated by carefully studying the following detailed description of the presently preferred exemplary embodiment of this invention taken in conjunction with the accompanying drawings, of which:

Figure 1:
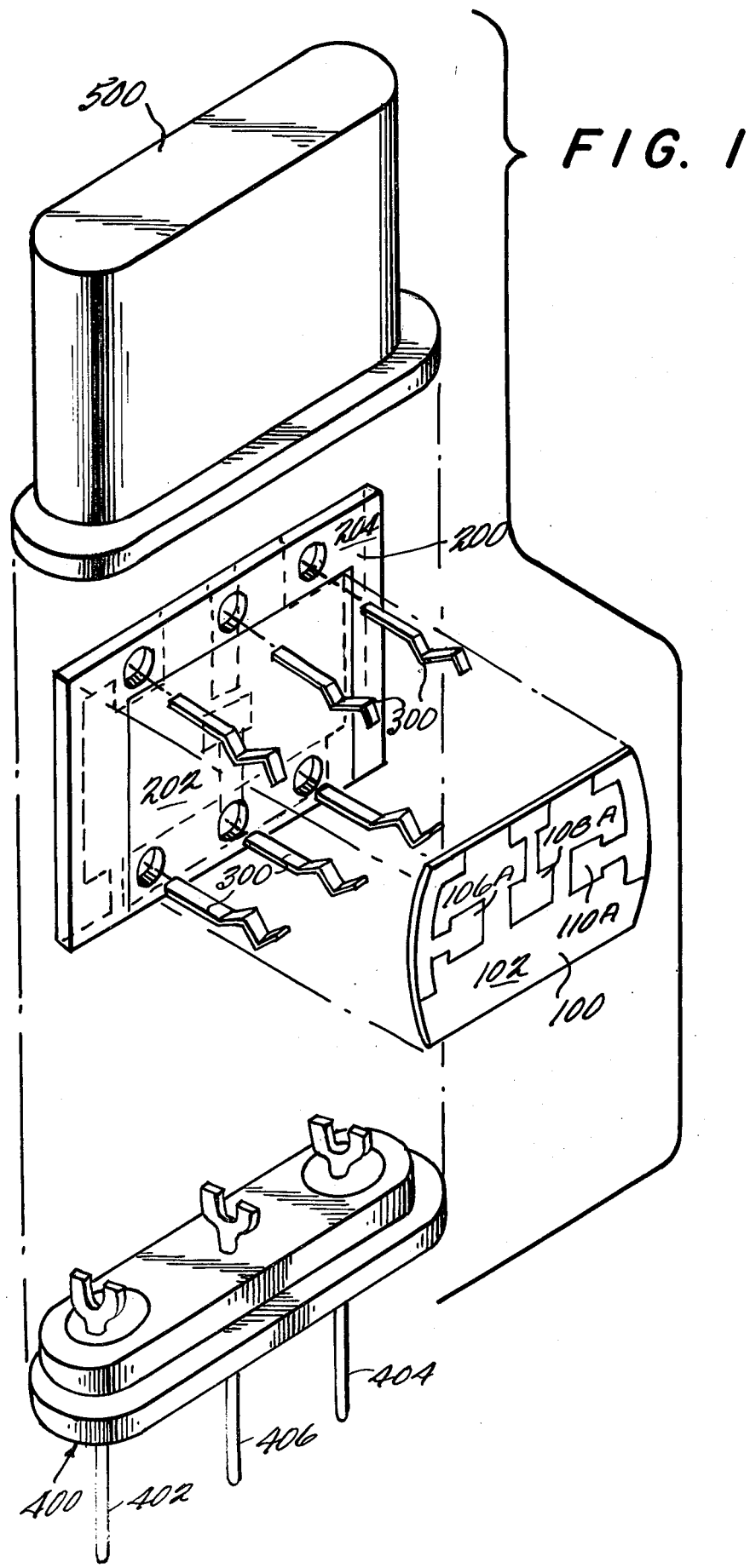
FIG. 1 is an exploded perspective front view of an exemplary monolithic crystal filter constructed in accordance with this invention.
Figure 2:
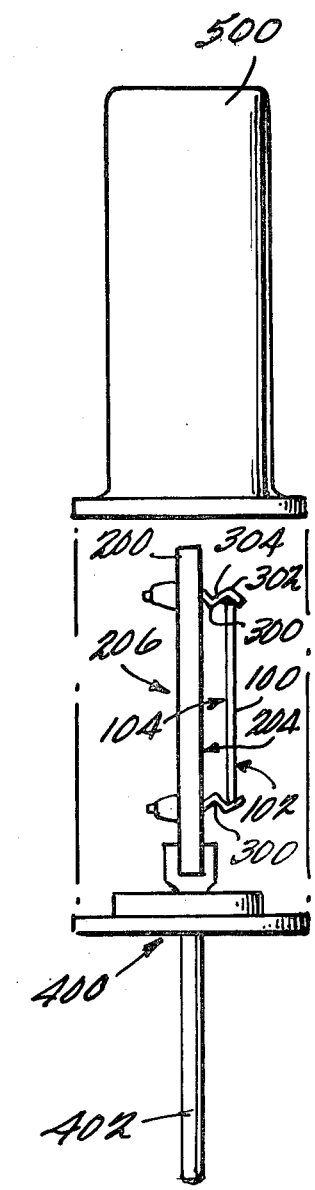
FIG. 2 is a partially exploded side view of the embodiment shown in FIG. 1.
Figure 3:
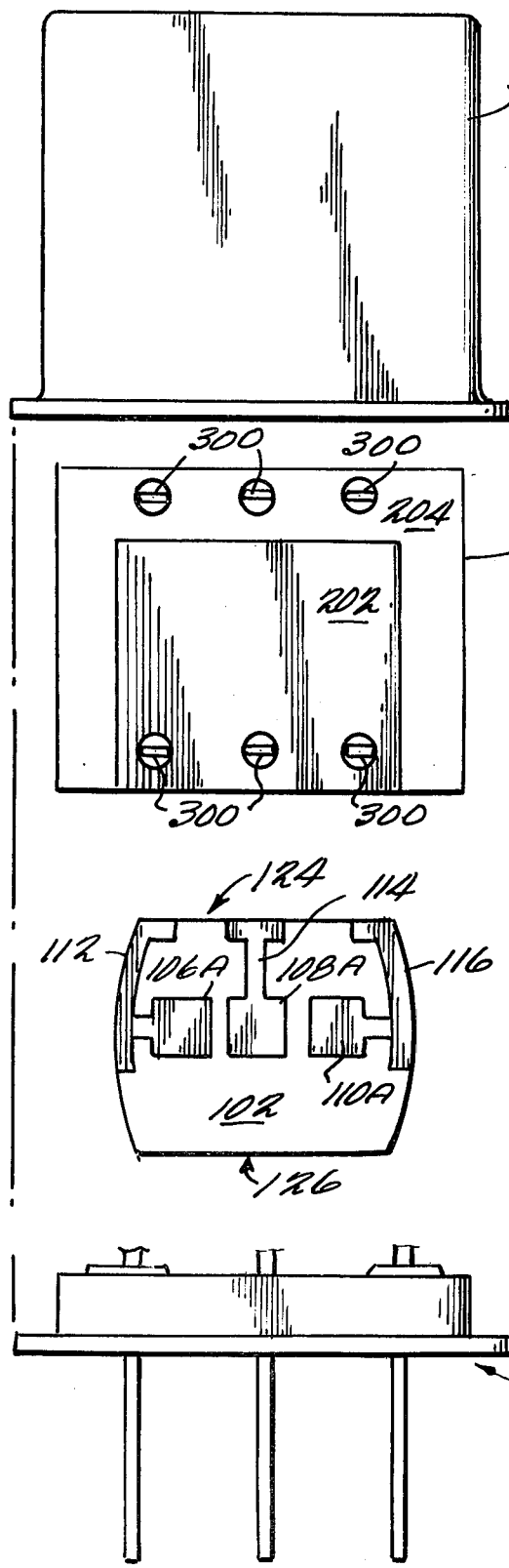
FIG. 3 is an exploded front view of the embodiment shown in FIG. 1.
Figure 4:
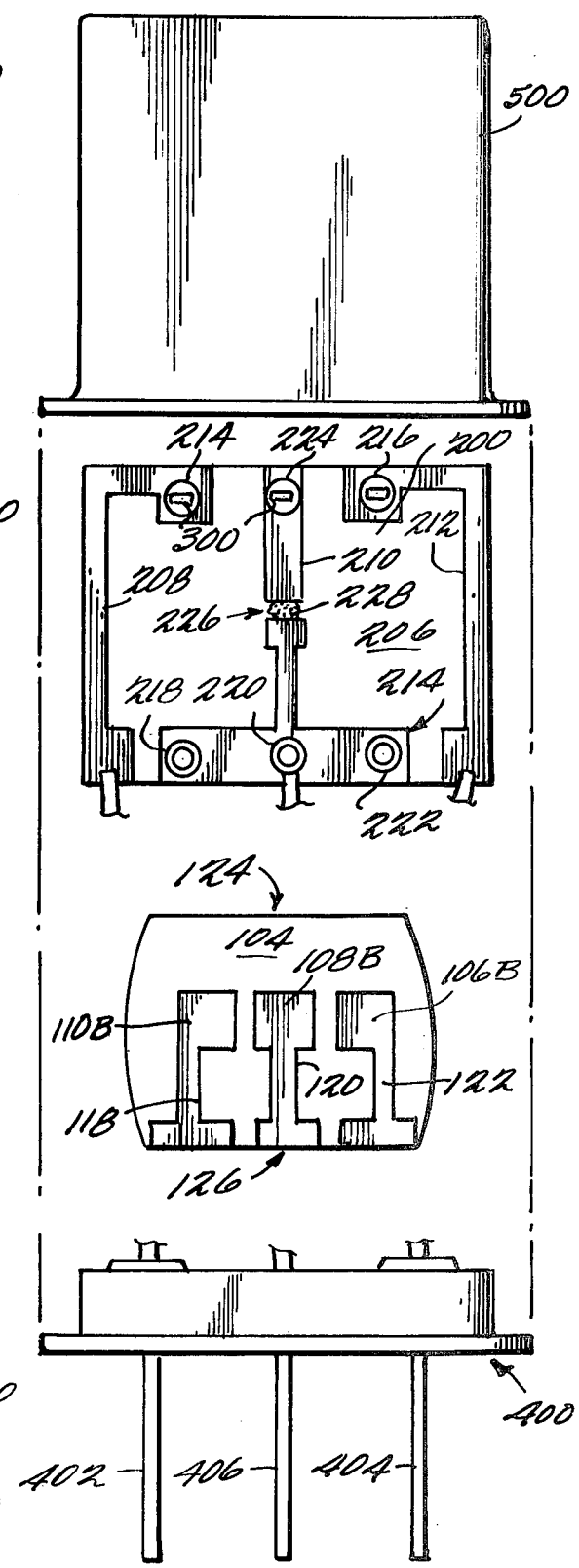
FIG. 4 is an exploded rear view of the embodiment shown in FIG. 1.
Figure 5:
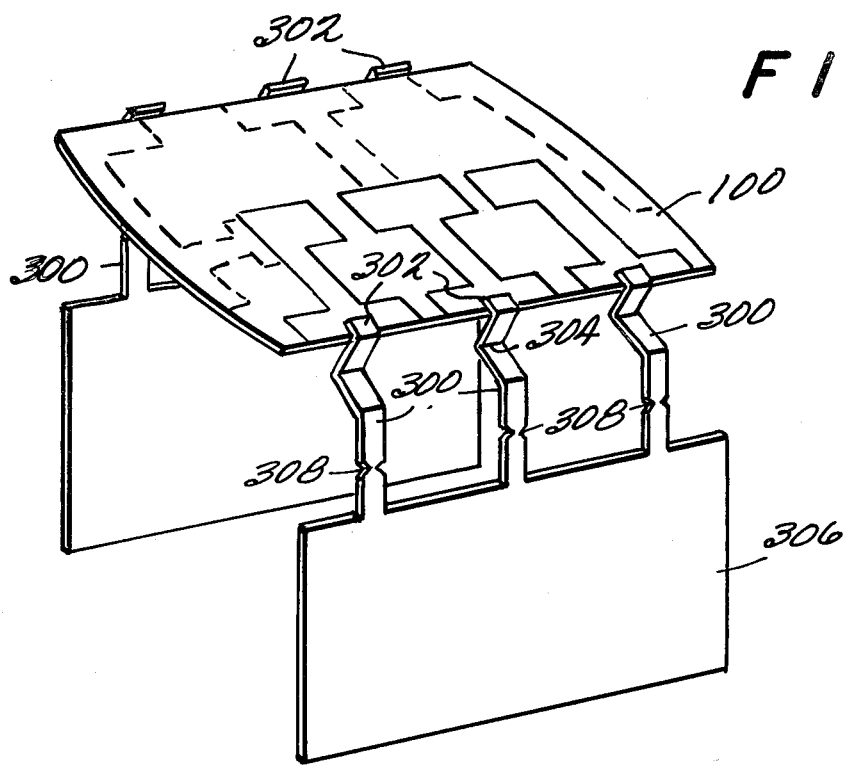
Figure 6:
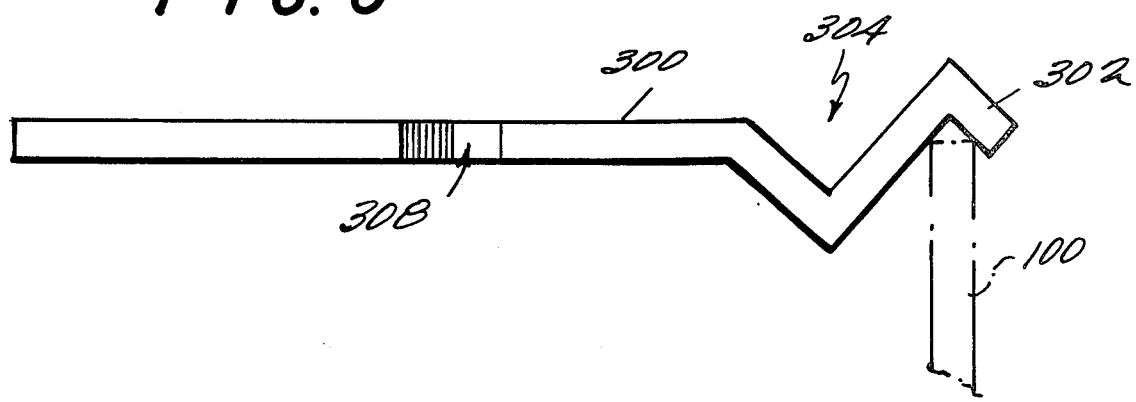
Figure 7:
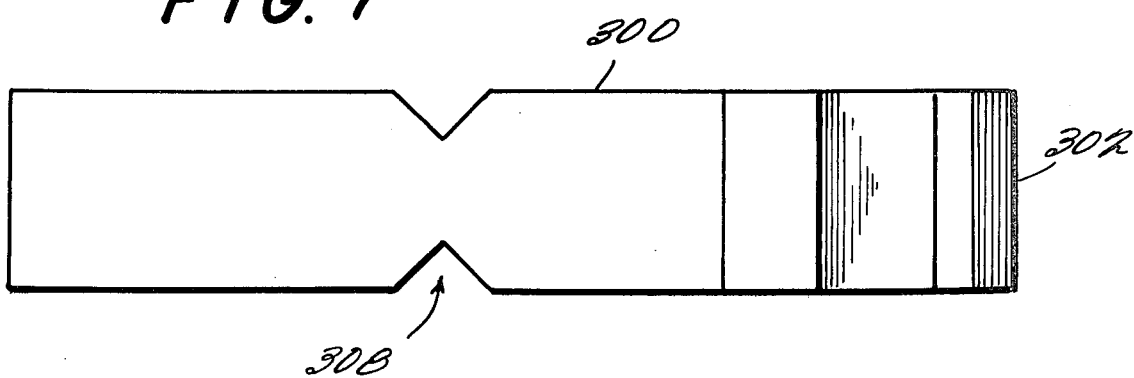

FIG. 5 is a perspective view of an intermediate step in the manufacture of the embodiment of FIG. 1 wherein plural lead wire fingers integrally connected to a frame "palm" are initially affixed to conductive areas at opposing edges of the crystal wafer before being severed from the "palm" at pre-defined "break away" points to provide an array of separate depending wire leads for insertion into a mating array of holes the ceramic support substrate; and FIGS. 6 and 7 are side and front views respectively of the bent beryllium copper lead wire fingers used to physically and electrically connect the crystal wafer to the ceramic support substrate in the embodiment of FIG. 1.

Multi-resonator crystal bodies having plural electrically conductive resonator electrode/lead structures disposed on opposite sides thereof to form a monolithic crystal filter are of course known in the prior art. The present exemplary embodiment is directed to a three-port or triple resonator monolithic crystal filter of this general type. Although the structure and techniques employed are also suited for filters having any number of ports.

Typically, the first and last resonator sections provide input/output ports for connection to external circuitry while the remaining internal resonators may be terminated in any impedance so long as, when so terminated, each resonator is tuned to the desired center frequency of the filter when all other resonators are short-circuited. The simplest, most reliable and hence most usual impedance for this purpose is a short-circuit across the internal resonator electrodes. The reason for this as well as the development of suitable equivalent circuits and design analysis of such equivalent circuits is already believed to be well known in the art and therefore will not be discussed in detail here.

Referring to the exemplary structure shown in FIGS. 1–4, it comprises a crystal wafer 100, a ceramic support substrate 200, six identical lead wire support structures 300, a conventional three pin connector base 400, and a conventional encapsulating cap structure 500.

The crystal wafer 100 is itself of generally conventional design and construction. It includes a front face 102 shown in FIG. 3 and an opposed rear face 104 shown in FIG. 4. These respective faces include three conductive electrodes pairs 106a, 106b; 108a, 108b; and 110a, 110b so as to define three separate but acoustically coupled resonator areas therebetween within the crystal wafer. As will be appreciated, the acoustic coupling between these three separate resonator areas and their respective resonant frequencies will be affected by the relative spacings, sizes, the mass of the electrode structures, crystal thickness, crystal orientation, etcetera. Conductive lead structures 112, 114, 116, 118, 120 and 122 are preferably formed simultaneously with the electrode structures and extend to corresponding opposing edges 124, 126 of the crystal wafer 100.

As will be appreciated by those in the art, two or more of the electrode structures on one side of the crystal wafer may actually be formed as one integral area if desired so long as separate electrode areas are formed on the opposite side so as to define separate resonator areas. For example, all of the electrodes 106b, 108b and 110b on the rear face 104 of crystal 100 may be formed as a single conductive area as may the conductive lead sections 118, 120 and 122 which lead to edge 126 of the crystal wafer. As will be later appreciated, all three of these electrode/lead areas on the rear face of the crystal are commonly connected to the same ground potential anyway in the exemplary embodiment.

The crystal wafer 100 is typically first subjected to a base plate vacuum deposition process wherein the shaped electrically conductive electrode/lead areas on the opposing crystal faces are initially formed. However, this initial "base plate" process typically stops considerably short of the final mass loading which is expected to be required for operation at the desired resonant frequencies of the various resonators. For example, the base plating process may typically be stopped while the resonators are still tuned to a frequency which is as much as 70 kHz or so higher than the intended operating frequency—with a considerable variation (e.g. ±15 kHz) between individual resonators in a given crystal wafer. In other words, the initial "base plate" process is only designed to roughly and approximately define the final mass loading and hence natural resonant frequency of the various coupled crystal resonators.

The final "finishing" step is typically achieved by first electroplating additional nickel material onto the base plate electrode/lead structures. The nickel plating process is typically controlled (e.g. as to time of termination) in accordance with contemporaneous resonant frequency measurements made while selectively short-circuiting and/or open-circuiting the electrode pairs defining the various coupled crystal resonators. Typically the nickel electroplating is only an initial step in the "finishing" process with the individual resonators remaining tuned slightly higher in frequency than desired (e.g. perhaps 2–10 kHz higher) but with the individual resonators on a given crystal having less variation between the respective resonant frequencies (e.g. within approximately 2 kHz of each other). The final "finishing" process is typically done in a vacuum environment where additional silver is deposited on the pre-existing electrode structures while once again simultaneously making resonant frequency measurements while connecting short-circuits and/or open-circuits across various of the resonator electrodes. Alternatively, the final silver deposition step in the finishing process may be carried out based upon calculations made using the results of resonant frequency measurements made at an earlier stage (e.g. during or after the nickel plating operation).

As will be appreciated during the following discussion, the presently preferred exemplary embodiment provides a structure which especially facilitates such typical finishing processes.

The thin ceramic substrate 200 includes an electrically conductive shield 202 (substantially the same size as or larger than the crystal wafer 100) on the front face 204 of the substrate 200. The rear face 206 of the substrate 200 includes four shaped conductive areas 208, 210, 212 and 214. The conductive areas 208 and 212 extend about the outer side edges so as to minimize stray capacitive coupling to the shield conductor 202 on the opposite side of the substrate. Conductors 208 and 212 provide conductive paths from holes 214 and 216 respectively to a lower portion of the substrate 200 where the upper end of pin connectors 402 and 404 are physically and electrically connected (e.g. with conductive cement). Conductive area 214 connects holes 218, 220 and 222 in common and is further physically and electrically connected to the upper end of the middle pin connector 406. Conductor 210 provides electrical connection from hole 224 in substrate 200 to a narrow gap area 226 between conductors 214 and 210. This gap, in the finished filter, is short-circuited with a conductor 228 (e.g. conductive cement); however, during the finishing stages, gap 226 permits selective connection of electrical circuits (e.g. temporary short-circuits) thereacross to assist in the tuning process.

Connection between the array of holes 214, 224, 216, 218, 220, and 222 on the rear face 206 of substrate 200 and the six contact areas at the opposing edges 124 and 126 of the crystal wafer 100 are made via a framework of six identical wire support structures 300. These wire supports typically have a first bend 302 so as to form a recess into which an edge of the crystal wafer is received and affixed (e.g. with conductive cement). The conductive wire supports also typically include a second subsequent bend 304 to provide added resiliency (for shock absorption) as well as to return the wire support member outwardly into alignment with respective ones of the holes in the substrate 200. Both mechanical and electrical connections between the substrate and the wire support members are also typically achieved by using conductive cement.

The resulting structure then comprises a multi-resonator monolithic crystal filter wafer 100 supported at its opposite edges by resilient wire leads 300. The wire leads 300 are, in turn, supported by the ceramic interface substrate 200 which is, in turn, supported by a conventional three pin base structure 400. An encapsulating cap 500 then completes the mechanical assembly. Electrical connections to the individual resonator electrodes are made via integral conductive areas on the crystal wafer faces, the supporting wire structures, shaped electrical conductors on the substrate 200 and the conventional pin connectors of the base 400.

It will be observed that all three terminal pairs of the three coupled resonators are easily accessible during fabrication and especially during the final finishing processes which result in the final tuning of the resonators.

For example, terminals associated with the center electrode pair are accessible via conductive areas 210 and 214 on the rear side of substrate 200. The two outside resonator electrode pairs are accessible between the common conductive area 214 and the separate conductive areas 208 and 212 respectively also disposed on the rear face of substrate 200. The conductive areas 208 and 212 are, of course, also individually accessible via the pin connectors 402 and 404 while the common conductive area 214 is accessible via pin connector 406. Thus, by connecting a probe to separate conductive area 210 on the backside of wafer 100 and by making conventional electrical connections to the pin connectors 402, 404 and 406, it is possible to selectively connect any desired circuit (including short-circuits and open-circuits) across any subset or all of the resonator electrodes during the final finishing processes. This greatly facilitates the measurements that are necessary to effect the desired final finishing of the electrode structures.

After the resonators are thus "finished" and tuned to their desired frequencies, in the preferred exemplary embodiment the middle electrode pair is short-circuited (without in any way disturbing the crystal itself and thus possibly altering its electrical characteristics) by merely short-circuiting the gap 226 between conductive areas 210 and 214. Typically, this is achieved by a conductive cement or paint placed across the gap 226 just prior to encapsulation within the cap 500. The resulting crystal-substrate-base assembly is typically conventionally sealed using either solder sealing or resistance welding.

A filter constructed in accordance with the exemplary embodiment, may be used to realize virtually any different type of filter. In particular, it is not limited to the realization of only one type of filter such as a Chebyshev type filter as may be the case with some prior art structures.

To facilitate manufacture of the exemplary embodiment, it is preferred that a linear array (e.g. three) of the bent lead supporting wires 300 be formed as an integral part of a connecting "palm" in a "lead frame" 306. In this manner, the three bent lead wires are initially held at desired parallel spaced relationships so that they may be accurately aligned with the edge contact areas on the crystal wafer 100 as depicted in FIG. 5. The formation of the bent lead wires (preferably from a sheet of beryllium copper) is effected using conventional metal forming techniques which therefore are not discussed here in detail.

The shape of the individual wire leads on the lead frame shown in FIG. 5 are depicted in detail at FIGS. 6 and 7 including the first and second bends 302 and 304 respectively. In addition, a weakened pre-defined "break area" 308 is provided along the shank of each of the individual lead wires 300. Thus, after the distal ends of the bent lead wires are cemented into place at the crystal edge, the frame palm 306 may be easily broken away from the individual lead wires (e.g. while they are held in a jig to protect the crystal wafer) so as to leave individual electrical wires depending from the wafer edge.

These six depending electrical wires are thereafter inserted through the mating array of six holes in the support substrate 200 and then cemented into place as should be appreciated in view of the previous discussion. Preferably, the assembled crystal wafer 100, substrate 200 and interconnecting lead wires 300 are also mounted to the pin connector base 400 before the final finishing processes are carried out on the electrodes of the crystal wafer. The process of measuring resonant frequencies while selectively connecting open-circuits and/or short-circuits to various of the resonator electrodes during the finishing process is itself well understood in the art and therefore not explained here in further detail.

While only one exemplary embodiment of this invention has been described in detail, those skilled in the art will recognize that there are many possible modifications and variations of this exemplary embodiment which may be made without substantially departing from many of the novel features and advantages of this invention. Accordingly, all such modifications and variations are intended to be included within the scope of the following claims.

What is claimed is:
1. A monolithic crystal filter comprising:
a multi-resonator crystal body having plural electrically conductive resonator electrode/lead structures disposed on opposite sides thereof;
a substrate member having plural electrical conductor areas disposed on at least one side thereof;
plural electrically conductive support members physically supporting said crystal body in a spaced-apart relationship from said substrate member and simultaneously electrically connecting respective ones of said resonator electrode/lead structures on the crystal body and said electrical conductor areas on the substrate member;
said conductor areas on said substrate member being disposed on a side thereof remote from said spaced-apart crystal body and further comprising an electrically conductive shield area disposed on the side of the substrate member nearest the spaced-apart crystal body thereby shielding the crystal body from the conductor areas on the substrate member.

2. A monolithic crystal filter as in claim 1 wherein said conductor areas on said substrate member provide individual electrical connections to each resonator on the crystal body such that the resonator electrodes associated therewith can be selectively open or short-circuited on said remote side of said substrate to facilitate selective individual tuning of the multi-resonator crystal resonators.

3. A monolithic crystal filter as in claim 2 wherein said conductor areas on said substrate member include a pair of adjacent but separate contact areas which are electrically connected thereacross to effect a short-circuit of at least one pair of resonator electrodes.

4. A monolithic crystal filter as in claim 1, 2, or 3 wherein said shield area occupies substantially less than all the available area on the nearest side of the substrate and wherein at least some of said conductor areas on the remote side of said substrate member pass substantially outside the shielded area so as to minimize stray capacitance associated therewith.

5. A monolithic crystal filter as in claim 1, 2 or 3 further comprising:
a plug-in base member having plural electrically conducting pins extending therethrough, and wherein said pins are individually electrically and physically connected to a corresponding conductor areas on the substrate member thereby supporting said substrate and its connected crystal body.

6. A monolithic crystal filter as in claim 5 further comprising an enclosure connected to said base member which encapsulates and protects said substrate and its connected crystal body.

7. A monolithic crystal filter as in claim 1, 2 or 3 wherein said substrate member includes an array of holes therein through which said support members extend.

8. A monolithic crystal filter as in claim 7 wherein each of said support members include a first bent portion defining a recess into which an edge of said crystal body is affixed and a second subsequent bent portion located between said crystal body and said substrate member adjacent an associated one of said holes.

9. A monolithic crystal filter as in claim 8 wherein each of said support members is cemented to said crystal body and to said substrate member with electrically conductive cement.

10. A monolithic crystal filter comprising:
a multi-resonator crystal wafer having two opposed faces with resonator electrodes disposed thereon defining plural acoustically coupled resonator areas and having electrical conductors disposed on said faces leading from respective ones of said electrodes to opposing edges of said opposed faces;
a support plate having two opposed faces with plural electrical conductors formed thereon on both sides and an array of projecting electrical lead wires extending therefrom affixed both to the opposed edges of said crystal wafer and to said support plate whereby said wafer is physically supported in a spaced-apart relationship opposite one face of the support plate and selectively electrically connected to corresponding electrical conductors on both sides of the support plate.

11. A monolithic crystal filter as in claim 10 wherein the electrical conductors on said support plate include a pair of adjacent conductive areas which can be electrically connected to effect an electrical short-circuit of at least one pair of resonator electrodes.

12. A monolithic crystal filter as in claim 10 wherein at least some of the electrical conductors on said support plate are disposed on a face remote from said crystal wafer and wherein said projecting lead wires extend through holes in said support plate.

13. A monolithic crystal filter as in claim 10 wherein said resonator electrodes are disposed in mated pairs on said opposing faces of the crystal wafer.

14. A monolithic crystal filter as in claim 10 wherein said support plate is larger in face area than the face area of said crystal wafer.

15. A monolithic crystal filter as in claim 10 wherein each of said projecting electrical lead wires includes a bent portion defining a recess into which an edge of said crystal wafer is affixed.

16. A monolithic crystal filter as in claim 15 wherein each of said projecting electrical lead wires includes a second bent portion located between said crystal wafer and said support plates.

17. A monolithic crystal filter as in claim 10, 15 or 16 wherein each of said electrical lead wires is cemented to said crystal wafer and to said support plate with electrically conductive cement.

18. A monolithic crystal filter as in claim 17 further comprising:
a plug-in pin base member having plural electrically conducting pins extending therethrough wherein said pins are electrically and physically connected to corresponding electrically conductive areas of said support plate; and
an enclosure connected to said base member which encapsulates and protects said support plate and its connected crystal wafer.

19. A monolithic crystal filter comprising:
a crystal wafer having first and second opposed faces;
three separate electrodes formed on said first face with three conductive leads also formed thereon, each lead extending from a respective electrode to a predetermined respective contact area adjacent an edge of the crystal wafer;
at least one electrode means formed on said second face opposite said three separate electrodes to form three corresponding acoustically coupled resonators on said crystal wafer including at least one conductive area on said second face extending from said electrode means to predetermined contact area(s) adjacent an edge of the crystal wafer;
a support structure disposed in a spaced-apart relationship with respect to the crystal wafer by electrical conductors which support said crystal wafer;
at least four separate conductive areas being formed on said substrate on the side remote from said crystal wafer, three of which are electrically connected individually to each of said three separate electrodes via their respective contact areas and at least one of which is electrically connected to said at least one electrode means via its contact area(s);
a connector base means supporting said support substrate and electrically connecting three of said separate conductive areas thereon to three pin connectors extending from said base for connection to external circuits.

20. A method of constructing a multi-resonator monolithic crystal filter comprising a crystal wafer supported on a non-conductive substrate, said method comprising the steps of:
depositing plural resonator electrode structures on opposing faces of said crystal wafer to form a multi-resonator crystal body having plural acoustically coupled crystal resonator areas which are only approximately tuned to desired frequencies;
providing conductive regions at selected locations of said substrate on at least the side remote from said wafer to facilitate formation of said resonator electrodes;
mounting said crystal wafer to said conductive regions of said support substrate using plural electrically conductive support wires through which electrical circuits may be selectively connected to at least one of said resonator electrodes via said conductive region remote from said wafer; and
finishing the formation of said resonator electrodes after said mounting step in conjunction with the selective connection of a predetermined electrical circuit to at said least one of said resonator electrodes.

21. A method as in claim 20 further comprising the steps of:
permanently effecting an electrical short-circuit across at least one of said resonator areas via circuits on said support substrate after said finishing step; and
encapsulating the resultant tuned structure in a pin connector base.

22. A method of constructing a multi-resonator monolithic crystal filter, said method comprising the steps of:

depositing plural resonator electrode structures on opposing faces of a crystal wafer to from a multi-resonator crystal body having plural acoustically coupled crystal resonator areas which are only approximately tuned to desired frequencies and including electrically conductive areas extending proximate at least one edge of said wafer;

affixing the edges of said crystal wafer to at least one lead wire frame having plural electrical conductors which effect respective electrical connections to said conductive areas proximate the wafer edge;

severing said plural electrical conductors from a common structure so as to leave individual electrical wires depending from the wafer edge;

inserting said depending electrical wires through mating holes in a support substrate and affixing same thereto to effect both mechanical connection to the substrate and electrical connection to shaped electrical conductors disposed on a side of said substrate through which electrical circuits may be selectively connected to at least one of said resonator electrodes;

finishing the formation of said resonator electrodes thereafter in conjunction with the selective connection of a predetermined electrical circuit to at least one of said resonator electrodes.

23. A monolithic crystal filter comprising:
a multi-resonator crystal body having plural electrically conductive resonator electrode/lead structures disposed on opposite sides thereof;

a non-conductive substrate member comprising plural electrical conductor areas disposed on the side thereof remote from said crystal body and having openings therein;

plural electrically conductive support members physically supporting said crystal body in a spaced-apart relationship from said substrate member and simultaneously electrically connecting respective ones of said resonator electrode/lead structures on the crystal body and said electrical conductor areas on the substrate member through said openings.

24. A monolithic crystal filter as in claim 23 wherein said conductor areas on said substrate member provide individual electrical connections to each resonator on the crystal body such that the resonator electrodes associated therewith can be selectively open or short-circuited on said remote side of said substrate to facilitate selective individual tuning of the multi-resonator crystal resonators.

25. A monolithic crystal filter as in claim 23 wherein each of said support members includes a first bent portion defining a recess into which an edge of said crystal body is affixed and a second subsequent bent portion located between said crystal body and said substrate member adjacent an associated on of said openings.

26. A monolithic crystal filter comprising:
a multi-resonator crystal wafer having two opposed faces with resonator electrodes disposed thereon defining plural acoustically coupled resonator areas and having electrical conductors disposed on said faces leading from respective ones of said electrodes to opposing edges of said opposed faces;

a support plate having two opposed faces with plural electrical conductors formed thereon and an array of projecting electrical lead wires extending therefrom affixed both to the opposed edges of said crystal wafer and to said support plate whereby said wafer is physically supported in a spaced-apart relationship opposite one face of the support plate and electrically connected to said electrical conductors on the support plate; and an electrically conductive shield formed on the face of said support plate adjacent said crystal wafer and extending sufficient to substantially shield said resonator areas from the electrical conductors on the remote face of the support plate.

* * * * *